US012787867B2

(12) United States Patent
Li et al.

(10) Patent No.: US 12,787,867 B2
(45) Date of Patent: Nov. 3, 2026

(54) CHIP STRUCTURE AND CHIP PREPARATION METHOD

(71) Applicant: Huawei Technologies Co., Ltd., Shenzhen (CN)

(72) Inventors: Heng Li, Shanghai (CN); Xiaodong Zhang, Shenzhen (CN); Tonglong Zhang, Shenzhen (CN); Simin Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1007 days.

(21) Appl. No.: 17/950,610

(22) Filed: Sep. 22, 2022

(65) Prior Publication Data

US 2023/0012986 A1 Jan. 19, 2023

Related U.S. Application Data

(63) Continuation of application No. PCT/CN2020/081088, filed on Mar. 25, 2020.

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 74/01* (2026.01); (Continued)

(58) Field of Classification Search
CPC . H01L 2225/06541; H01L 2225/06513; H01L 23/481; H01L 25/0657; H01L 2225/06517; H01L 25/50; H01L 2224/08145; H01L 2224/16145; H01L 2224/32145; H01L 2224/32225; H01L 24/08; H01L 24/16; H01L 24/80; H01L 25/18; H10D 84/038; H10D 88/00;
(Continued)

(56) References Cited

U.S. PATENT DOCUMENTS

2003/0168254 A1* 9/2003 Kariya .................... H01L 24/29
257/E21.705
2018/0190617 A1* 7/2018 Chew ...................... H01L 25/50
2020/0135698 A1* 4/2020 Hong .................. H01L 23/3135

FOREIGN PATENT DOCUMENTS

CN 104425425 A 3/2015
CN 106783763 A 5/2017
(Continued)

*Primary Examiner* — Jessica S Manno
*Assistant Examiner* — Victor Joseph Lasasso
(74) *Attorney, Agent, or Firm* — WOMBLE BOND DICKINSON (US) LLP

(57) ABSTRACT

This disclosure provides a chip structure, including a first chip and a first protective layer, where the first protective layer covers a first surface of the first chip; and a first conductive connector is vertically disposed in the first protective layer, the first conductive connector penetrates through an upper surface and a lower surface of the first protective layer, one end of the first conductive connector is electrically connected to the first surface of the first chip, the other end of the first conductive connector is exposed to the first protective layer, and the first protective layer is formed by a material whose modulus is greater than a preset value.

15 Claims, 5 Drawing Sheets

(51) Int. Cl.
*H10W 72/00* (2026.01)
*H10W 72/20* (2026.01)
*H10W 74/01* (2026.01)
*H10W 74/10* (2026.01)

(52) U.S. Cl.
CPC .... *H10W 74/137* (2026.01); *H10W 72/01208* (2026.01); *H10W 72/01235* (2026.01); *H10W 72/01257* (2026.01); *H10W 72/248* (2026.01); *H10W 72/252* (2026.01); *H10W 90/722* (2026.01); *H10W 90/724* (2026.01)

(58) Field of Classification Search
CPC .... H10D 88/01; H10W 90/00; H10W 90/297; H10W 90/722; H10W 90/724
See application file for complete search history.

(56) References Cited

FOREIGN PATENT DOCUMENTS

| | | | |
|---|---|---|---|
| CN | 107910315 | A | 4/2018 |
| CN | 109801883 | A | 5/2019 |
| CN | 110708891 | A | 1/2020 |
| JP | 2013153071 | A | 8/2013 |

* cited by examiner

CHIP STRUCTURE AND CHIP PREPARATION METHOD

CROSS-REFERENCE TO RELATED APPLICATIONS

This application is a continuation of International Application No. PCT/CN2020/081088, filed on Mar. 25, 2020, the disclosure of which is hereby incorporated by reference in its entirety.

TECHNICAL FIELD

This application relates to the field of chip technologies, and in particular, to a chip structure and a chip preparation method.

BACKGROUND

As a pace of Moore's Law slows down, costs of component miniaturization on a chip are increasing. Therefore, chip package becomes increasingly important in an industry chain. In a three-dimensional (3D) chip stacking solution, chips are stacked in a vertical direction. This can greatly improve system integration, and is of great significance.

Due to rapid development of a chip technology, a chip thickness continuously decreases. Currently, more ultra-thin chips are available. However, as the chip thickness decreases, strength of the chip becomes lower. Consequently, there is a problem of clamping difficulty and stacking difficulty in a packaging process of the ultra-thin chip. The ultra-thin chip with low strength is easily broken in a clamping process or a stacking process due to impact of a factor such as an external force.

SUMMARY

Embodiments of this application provide a chip structure and a chip preparation method. A protective layer formed by a high modulus material is added to a chip as a support structure of the chip. This increases a chip thickness and effectively improves strength of the chip, so that the chip can have a strong deformation resistance capability. Therefore, a risk that the chip is broken in a clamping process or a stacking process is reduced.

A first aspect of embodiments of this application provides a chip structure, including a first chip and a first protective layer, where the first protective layer covers a first surface of the first chip; and a first conductive connector is vertically disposed in the first protective layer, the first conductive connector penetrates through an upper surface and a lower surface of the first protective layer, one end of the first conductive connector is electrically connected to the first surface of the first chip, the other end of the first conductive connector is exposed to the first protective layer, and the first protective layer is formed by a material whose modulus is greater than a preset value.

In some embodiments, a second conductive connector is disposed on a second surface of the first chip, and one end of the second conductive connector is electrically connected to the second surface of the first chip; and the second surface is an opposite surface of the first surface, and the second surface is an active surface or a passive surface of the first chip.

In some embodiments, a second protective layer covers the second surface of the first chip, the second conductive connector is vertically disposed in the second protective layer, the second conductive connector penetrates through an upper surface and a lower surface of the second protective layer, the other end of the second conductive connector is exposed to the second protective layer, and the second protective layer is formed by a material whose modulus is greater than the preset value.

In some embodiments, the first protective layer is formed by a material whose modulus is greater than 5 GPa (gigapascals).

In some embodiments, the first protective layer is a polymer protective layer, a silicon nitride protective layer, or a silicon oxide protective layer.

In some embodiments, a thickness of the first protective layer is 10 um to 50 um.

In some embodiments, the first protective layer covers the first surface of the first chip by using a molding process.

In some embodiments, a through silicon via TSV is prepared on the first chip.

In some embodiments, the chip structure further includes a second chip, where the first surface or the second surface of the first chip is bonded to the second chip, so that the first chip is stacked above the second chip.

A second aspect of embodiments of this application provides a wafer structure, including a wafer and a third protective layer, where the third protective layer covers a first surface of the wafer; and a third conductive connector is vertically disposed in the third protective layer, the third conductive connector penetrates through an upper surface and a lower surface of the third protective layer, one end of the third conductive connector is electrically connected to the first surface of the wafer, the other end of the third conductive connector is exposed to the third protective layer, and the third protective layer is formed by a material whose modulus is greater than a preset value.

In some embodiments, the third protective layer is formed by a material whose modulus is greater than 5 GPa.

In some embodiments, the third protective layer is a polymer protective layer, a silicon nitride protective layer, or a silicon oxide protective layer.

In some embodiments, a thickness of the third protective layer is 10 um to 50 um.

In some embodiments, the first protective layer covers the first surface of the first chip by using a molding process. A third aspect of embodiments of this application provides a chip preparation method, including: preparing a first protective layer and a first conductive connector on a first surface of a first chip, so that the first protective layer covers the first surface of the first chip, where the first conductive connector is vertically disposed in the first protective layer, the first conductive connector penetrates through an upper surface and a lower surface of the first protective layer, one end of the first conductive connector is electrically connected to the first surface of the first chip, the other end of the first conductive connector is exposed to the first protective layer, and the first protective layer is formed by a material whose modulus is greater than a preset value.

In some embodiments, the preparing a first protective layer and a first conductive connector on a first surface of a first chip includes: preparing the first conductive connector on the first surface of the first chip, so that the one end of the first conductive connector is electrically connected to the first surface of the first chip; covering a protective material on the first surface of the first chip by using a molding process, to form the first protective layer, where the protective material is a material whose modulus is greater than the preset value; and grinding the first protective layer to expose the other end of the first conductive connector.

In some embodiments, the preparing a first protective layer and a first conductive connector on a first surface of a first chip includes: covering a protective material on the first surface of the first chip by using a molding process, to form the first protective layer; etching the first protective layer to form a vertical channel being capable of exposing the first surface of the first chip; and preparing the first conductive connector in the vertical channel of the first protective layer, so that the one end of the first conductive connector is electrically connected to the first surface of the first chip.

In some embodiments, the method further includes: preparing a second conductive connector on a second surface of the first chip, so that one end of the second conductive connector is electrically connected to the first chip, where the second surface is an opposite surface of the first surface, and the second surface is an active surface or a passive surface of the first chip.

In some embodiments, the method further includes: covering the protective material on the second surface of the first chip by using the molding process, to form a second protective layer, where the second conductive connector is vertically disposed in the second protective layer, the second conductive connector penetrates through an upper surface and a lower surface of the second protective layer, and the other end of the second conductive connector is exposed to the second protective layer.

In some embodiments, the method further includes: preparing a TSV on the second surface of the first chip, where the second surface is the active surface of the first chip; and grinding the first surface of the first chip by using a backside via reveal BVR process, so that the TSV is exposed to the first surface.

In some embodiments, the method further includes: bonding the first surface or the second surface of the first chip to a second chip, so that the first chip is stacked above the second chip.

Embodiments of this application provide the chip structure and the chip preparation method. The chip structure includes a first chip and a first protective layer, where the first protective layer covers a first surface of the first chip; and a first conductive connector is vertically disposed in the first protective layer, the first conductive connector penetrates through an upper surface and a lower surface of the first protective layer, one end of the first conductive connector is electrically connected to the first surface of the first chip, the other end of the first conductive connector is exposed to the first protective layer, and the first protective layer is formed by a material whose modulus is greater than a preset value. The protective layer formed by a high modulus material is added to the chip. This increases a chip thickness and effectively improves strength of the chip, so that the chip has a strong deformation resistance capability. Therefore, a risk that the chip is broken in a clamping process or a packaging process is reduced.

DESCRIPTION OF EMBODIMENTS

Figure 1:
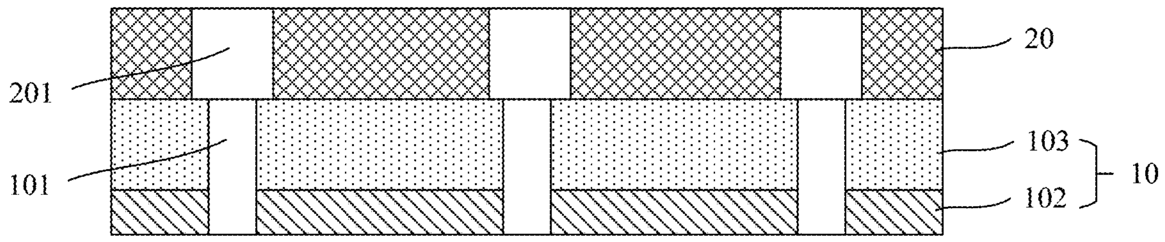
FIG. 1 is a schematic diagram of a cross section of a chip structure according to an embodiment of this application.

To make the objectives, technical solutions, and advantages of this application clearer, the following describes embodiments of this application with reference to the accompanying drawings. Clearly, the described embodiments are merely some rather than all of embodiments of this application. It may be learned by a person of ordinary skill in the art that, with emergence of a new application scenario, the technical solutions provided in embodiments of this application are also applicable to similar technical problems.

In the specification, claims, and accompanying drawings of this application, the terms "first", "second", and so on are intended to distinguish between similar objects but do not necessarily indicate an order or sequence. It should be understood that the data used in such a way is interchangeable in appropriate circumstances, so that embodiments described herein can be implemented in an order other than the content illustrated or described herein. Moreover, terms "include", "have", and any other variant thereof are intended to cover non-exclusive inclusion. For example, a process, a method, a system, a product, or a device that includes a series of operations or modules is not necessarily limited to those expressly listed operations or modules, but may include other operations or modules not expressly listed or inherent to the process, the method, the product, or the device. Names or numbers of operations in this application do not mean that the operations in the method procedure need to be performed in a time/logical sequence indicated by the names or numbers. An execution sequence of the operations in the procedure that have been named or numbered can be changed based on a technical objective to be achieved, provided that same or similar technical effects can be achieved.

The following clearly describes the technical solutions in this application with reference to the accompanying drawings in this application. It is clear that the described embodiments are merely some but not all of embodiments of this application. The following embodiments may be combined with each other. For same or similar content, details are not described in different embodiments. It should be further noted that lengths, widths, and heights (or thicknesses) of various components shown in embodiments of this application are merely examples for description, and do not constitute any limitation on the chip structure of this application.

Currently, in the integrated circuit field, a smaller component size has a higher package thickness requirement. To meet the package thickness requirement, a chip thickness continuously decreases. Currently, more ultra-thin chips are available. However, as the chip thickness decreases, strength of the chip becomes lower. In a transferring or 3D stacking process of an ultra-thin chip, some external causes such as an external force or a thermal pressure are easily brought to the ultra-thin chip due to improper clamping or some process operations in the 3D stacking process. Consequently, when strength of the ultra-thin chip is quite low, the ultra-thin chip is easily broken under influence of an external cause.

In addition, when the ultra-thin chip has a through silicon via (TSV) formed by electroplated metal or the like, a stress concentration point easily occurs inside the ultra-thin chip, and a stress situation of the ultra-thin chip is complex. Under influence of the external cause, the ultra-thin chip with a TSV is more likely to be broken.

In view of this, an embodiment of this application provides a chip structure. A protective layer formed by a high modulus material is added to a chip as a support structure of the chip. This increases a chip thickness and effectively improves strength of the chip, so that the chip can have a strong deformation resistance capability. Therefore, a risk that the chip is broken in a clamping process or a stacking process is reduced.

It should be noted that, a chip thickness reduced due to process advancement is far greater than a thickness of the added protective layer in this embodiment of this application. In other words, in this embodiment of this application, after the protective layer is added to the chip, a small chip thickness can still be maintained. Therefore, the strength of the chip can be effectively improved while ensuring that the chip meets a package requirement. FIG. 1 is a schematic diagram of a cross section of a chip structure according to an embodiment of this application. As shown in FIG. 1, the chip structure provided in this embodiment of this application includes a first chip 10 and a first protective layer 20.

In some embodiments, a TSV 101 may be prepared on the first chip 10. The TSV 101 is disposed through the first chip 10, that is, two ends of the TSV 101 are respectively exposed to an active surface and a passive surface of the first chip 10. It should be noted that, the active surface of the chip is usually a surface on which a component is disposed on the chip, and is also referred to as a front surface of the chip. The passive surface of the chip is a surface on which no component is disposed on the chip, and is also referred to as a back surface of the chip. The first chip 10 may be alternatively a chip without a TSV. This is not limited in this embodiment of this application.

It should be noted that, the first chip 10 may include a metal component layer 102 and a substrate layer 103. In a chip manufacturing process, components such as a conductive metal wire and a transistor can be prepared on the chip by using a front end of line and a back end of line on a silicon substrate, so that the metal component layer and the substrate layer are formed on the chip. Usually, one surface on which the metal component layer is located is the active surface, and the other surface on which the substrate layer is located is the passive surface.

The first protective layer 20 covers a first surface of the first chip 10. A first conductive connector 201 is vertically disposed in the first protective layer 20. The first conductive connector 201 penetrates through an upper surface and a lower surface of the first protective layer 20. The first surface of the first chip 10 may be in contact with the upper surface or the lower surface of the first protective layer 20. One end of the first conductive connector 201 is electrically connected to the first surface of the first chip 10, and the other end of the first conductive connector 201 is exposed to the first protective layer 20.

In some embodiments, the first protective layer 20 may cover the first surface of the first chip 10 by using a molding process. A thermosetting material may be poured on the first surface of the first chip 10, and after the thermosetting material cools, the first protective layer 20 covering the first chip 10 can be formed. The molding process is used to cover the first protective layer 20 on the first chip 10, so that the first protective layer 20 and the first chip 10 can be firmly attached to each other. This helps form effective support of the first protective layer 20 for the first chip 10, and improves a deformation resistance capability of the first chip 10.

When the TSV 101 is prepared on the first chip 10, one end of the first conductive connector 201 is connected to the TSV 101, and the other end of the first conductive connector 201 is exposed to the first protective layer 20. The first conductive connector 201 may be a conductive connector such as a copper pillar.

The first surface of the first chip 10 may be a passive surface, that is, the first protective layer 20 covers the passive surface of the first chip 10. A signal of the TSV 101 is led out by using the first conductive connector 201 disposed in the first protective layer 20, so that the TSV 101 can be electrically connected to another chip or line by using the first conductive connector 201.

A thickness of the first protective layer 20 may be determined based on a thickness of the first chip 10 or a thickness requirement of chip stack package, so that the first protective layer 20 can ensure an overall thickness of the first chip 10 or meet the thickness requirement of chip stack package while improving strength of the first chip 10. For example, when the thickness of the first chip 10 is 20 um, the thickness of the first protective layer 20 may be 10 um to 50 um. The thickness of the first protective layer 20 may be 30 um. In other words, the overall thickness of the first chip 10 covered with the first protective layer 20 is 50 um. This can effectively improve the overall thickness of the first chip 10, and improve strength of the first chip 10. The thickness of the first protective layer 20 is not limited in this embodiment of this application.

It should be noted that, to ensure that the first protective layer 20 can effectively improve strength of the chip, the first protective layer 20 is formed by a material whose modulus is greater than a preset value. The modulus refers to a ratio of a stress to a strain of a material under a stress state. To put it simply, the modulus may be considered as an indicator for measuring a difficulty degree of deformation of a material. A larger modulus indicates a greater stress that causes deformation of the material, that is, a greater stiffness of the material, or in other words, smaller deformation of the material under the action of a stress.

The foregoing preset value may be determined based on an actual situation, for example, may be determined based on a chip stacking process or a clamping manner in a chip transfer process. In some embodiments, the first protective layer 20 may be formed by a material whose modulus is greater than 5 GPa. For example, the first protective layer 20 may be a polymer protective layer, a silicon nitride protective layer, or a silicon oxide protective layer.

In this embodiment, the protective layer formed by a high modulus material is added to the chip as a support structure of the chip. This increases a chip thickness and effectively improves strength of the chip, so that the chip can have a strong deformation resistance capability. Therefore, a risk that the chip is broken in a clamping process or a stacking process is reduced.

Figure 2:
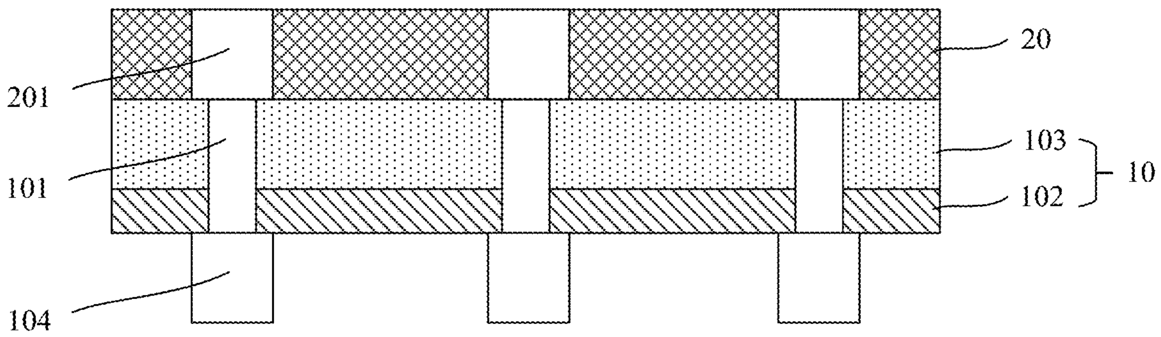
FIG. 2 is a schematic diagram of a cross section of a chip structure according to an embodiment of this application.

FIG. 2 is a schematic diagram of a cross section of a chip structure according to an embodiment of this application. As shown in FIG. 2, in an embodiment, a second conductive connector 104 is disposed on a second surface of the first chip. One end of the second conductive connector 104 is connected to the first chip 10, to lead out a signal of the first chip 10. The second surface is an opposite surface of the first surface, that is, the second surface is the active surface of the first chip. The second conductive connector 104 may be a conductive connector such as a copper pillar or a micro bump.

Usually, for a flat plate, a relationship between two planes of the flat plate that are away from each other may be referred to as opposite. The first chip 10 is a flat plate, and therefore the first surface and the second surface of the first chip 10 are two planes in the first chip 10 that are away from each other.

In this embodiment, the second conductive connector 104 is disposed on the second surface of the first chip 10. Therefore, when needing to be stacked on another chip or circuit structure, the first chip 10 may be connected to the other chip or circuit structure by using the second conductive connector 104. The first chip 10 may be integrated into the other chip or circuit structure through direct welding or in another manner. This avoids that the first chip 10 needs to be integrated into the other chip or circuit structure in a high-cost hybrid bonding manner when there is no conductive connector on the second surface.

Figure 3:
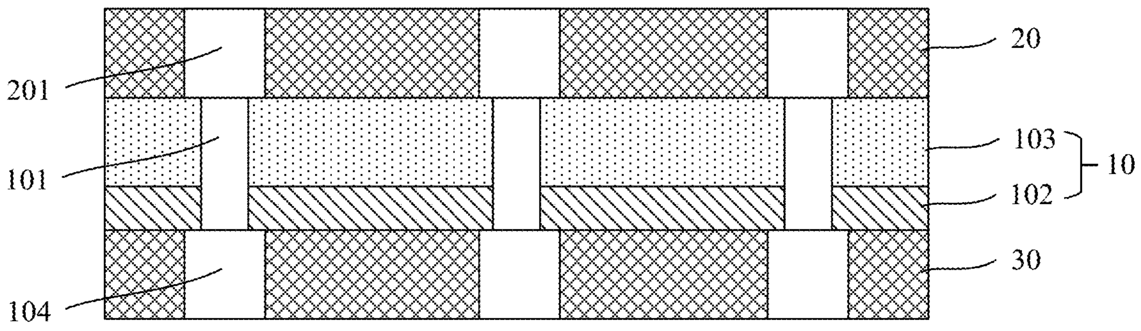
FIG. 3 is a schematic diagram of a cross section of a chip structure according to an embodiment of this application.

FIG. 3 is a schematic diagram of a cross section of a chip structure according to an embodiment of this application. As shown in FIG. 3, in another embodiment, a second protective layer 30 further covers the second surface of the first chip 10. The second conductive connector 104 is disposed through the second protective layer 30. The other end of the second conductive connector 104 is exposed to the second protective layer.

In other words, the second protective layer 30 for improving strength of the first chip 10 is further disposed on the second surface of the first chip 10, so that the first chip 10 may be located between the first protective layer 20 and the second protective layer 30 to form a sandwiched protective structure. This can effectively improve strength of the first chip 10 and prevent the first chip 10 from being broken in a clamping process or a stacking process. In addition, the second conductive connector 104 is disposed through the second protective layer 30 to lead out a signal on the active surface of the first chip 10. This prevents the second protective layer 30 from affecting normal operation of the first chip 10.

A thickness of the second protective layer 30 may be determined with reference to the thickness of the first chip 10 and the thickness of the first protective layer 20, so that the first protective layer 20 and the second protective layer 30 can ensure an overall thickness of the first chip 10 or meet a thickness requirement of chip stack package while improving strength of the first chip 10. For example, when the thickness of the first chip 10 is 20 um and the thickness of the first protective layer 20 is 15 um, the thickness of the second protective layer 30 may be 15 um to 30 um. Preferably, the thickness of the second protective layer 30 may be 15 um. In other words, the overall thickness of the first chip 10 covered with the first protective layer and the second protective layer 30 is 50 um. This can effectively improve the overall thickness of the first chip 10, and improve strength of the first chip 10. The thickness of the second protective layer 30 is not limited in this embodiment of this application.

It should be noted that, to ensure that the second protective layer 30 can effectively improve strength of the chip, the second protective layer 30 may also be formed by a material whose modulus is greater than a preset value. In some embodiments, the second protective layer 30 and the first protective layer 20 may be formed by a same material. In some embodiments, the second protective layer 30 may be formed by a material whose modulus is greater than 5 GPa. For example, the second protective layer 30 may be a polymer protective layer, a silicon nitride protective layer, or a silicon oxide protective layer.

Figure 4:
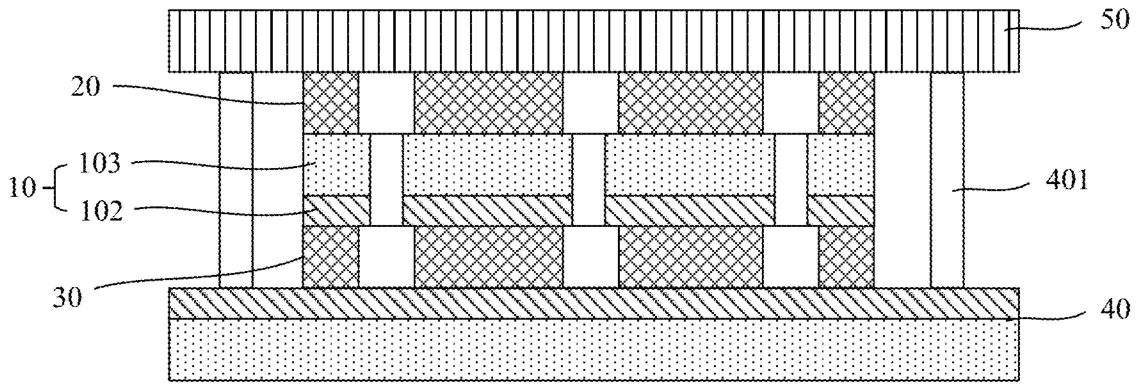
FIG. 4 is a schematic diagram of a cross section of a chip stack structure according to an embodiment of this application.

FIG. 4 is a schematic diagram of a cross section of a chip stack structure according to an embodiment of this application. As shown in FIG. 4, the chip stack structure includes a first chip 10 and a second chip 40. A second conductive connector 104 on an active surface of the first chip 10 is bonded to an active surface of the second chip 40, so that the first chip 10 is stacked above the second chip 40. In other words, in this embodiment, the active surface of the first chip 10 is bonded to the active surface of the second chip 40. For a structure of the first chip 10, refer to the embodiment corresponding to FIG. 3. Details are not described herein again.

In some embodiments, one or more carrier boards 50 may be further prepared above the first chip 10. The carrier board 50 may be a redistribution layer (RDL), a conventional substrate, a silicon substrate (also referred to as an interposer), or the like. Lines are disposed on a surface and an interior of the carrier board 50. In FIG. 4, a line on a lower surface of the carrier board 50 is electrically connected to the first chip 10 by using the conductive connector in the first protective layer 20, and is further electrically connected to the second chip 40 by using a conductive connector 401. The line inside the carrier board 50 is configured to electrically connect the line on the lower surface of the carrier board and a line on an upper surface of the carrier board. Usually, compared with the substrate, the RDL and the silicon substrate have smaller thicknesses and higher integration, which better meet an integration requirement of an integrated circuit. However, the RDL and the silicon substrate have lower stress resistance than the substrate, and are deformed more obviously when being subject to a stress. Consequently, the entire chip structure is more prone to cracking. However, the protective layers 20 and 30 are disposed in the chip structure of the present disclosure, to improve a capability of the entire structure to resist stress and deformation, and avoid cracking.

A first conductive connector 201 on the first chip 10 is connected to the RDL 50, so that the first chip 10 is electrically connected to another chip or circuit structure by using the RDL 50, to lead out a signal of the first chip 10. The second chip 40 located below the first chip 10 may also be connected to the RDL 50 by using the conductive connector 401 (for example, a copper pillar or a solder ball), so that the second chip 40 is electrically connected to the another chip or circuit structure by using the RDL 50, to lead out a signal of the second chip 40. In addition, a gap between the second chip 40 and the RDL 50 may be further filled, by using a molding process, with a molding material (not shown in the figure for ease of viewing) used for filling, to support the RDL 50.

Figure 5:
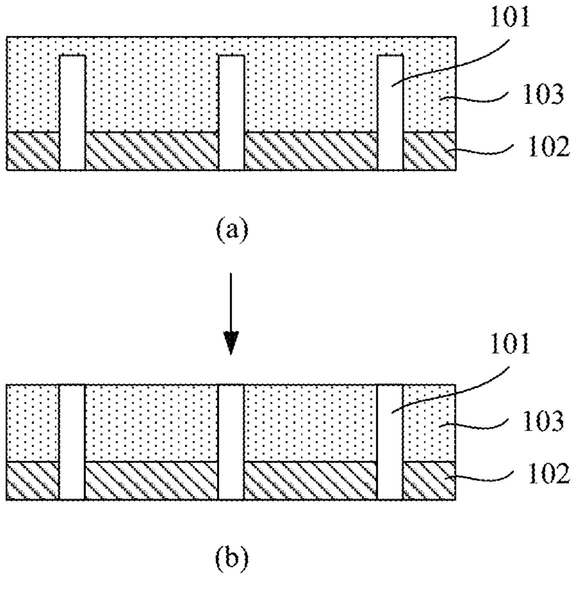
FIG. 5 is a schematic flowchart of a chip preparation method according to an embodiment of this application.

For ease of understanding, the following describes in detail a preparation process of the chip stack structure corresponding to FIG. 4. FIG. 5 is a schematic flowchart of a chip preparation method according to an embodiment of this application.

Operation 1: Prepare a TSV 101 on a first chip 10, which is shown in (a) in FIG. 5. Puncturing may be performed through etching on an active surface of the first chip 10 in a direction towards a passive surface, and then electroplating is performed on a hole obtained through etching, to obtain the TSV 101.

Operation 2: Grind the passive surface of the first chip 10 by using a backside via reveal (BVR) process to expose the TSV 101 on the passive surface, which is shown in (b) in FIG. 5. A process of grinding the passive surface of the first chip 10 by using the BVR process to expose the TSV 101 may include: thinning the passive surface of the first chip 10 in a grinding manner to a location close to the TSV 101; then, removing silicon above the TSV 101 through dry etching or wet etching, to expose metal of the TSV 101; after that, preparing, by using a chemical vapor deposition (CVD) method or the like, a passivation layer (for example, an oxide layer or a nitride layer) for protecting the TSV 101; and finally performing grinding to expose the TSV 101.

Figure 6:
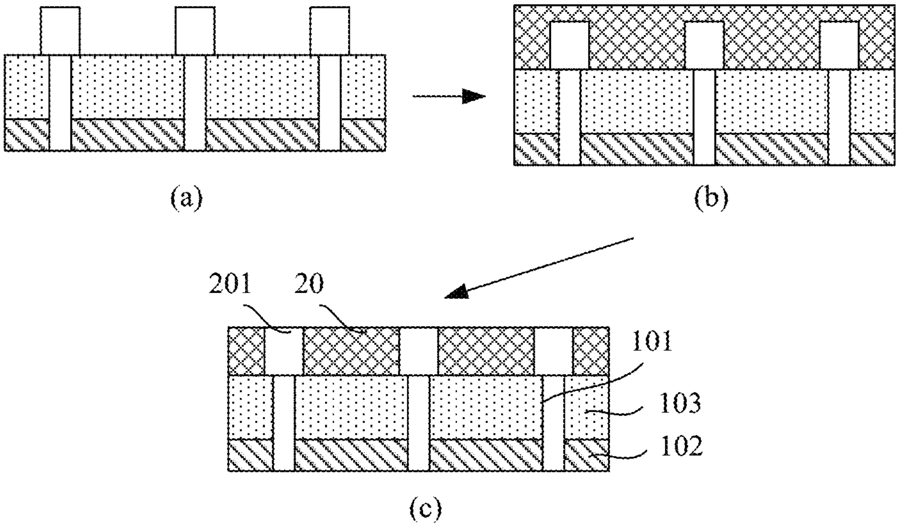
FIG. 6 is a schematic flowchart of a chip preparation method according to an embodiment of this application.

Operation 3: Prepare a first protective layer 20 and a first conductive connector 201 on the passive surface of the first chip 10. As shown in (a) in FIG. 6, the first conductive connector 201 is first prepared on the passive surface of the first chip 10. Then, as shown in (b) in FIG. 6, a high modulus material (for example, a polymer material, a silicon nitride material, or a silicon oxide material) is used to cover the first conductive connector 201, to form the first protective layer 20 covering the passive surface of the first chip 10. Finally, as shown in (c) in FIG. 6, grinding is performed on a surface of the first protective layer 20, to expose the first conductive connector 201.

Figure 7:
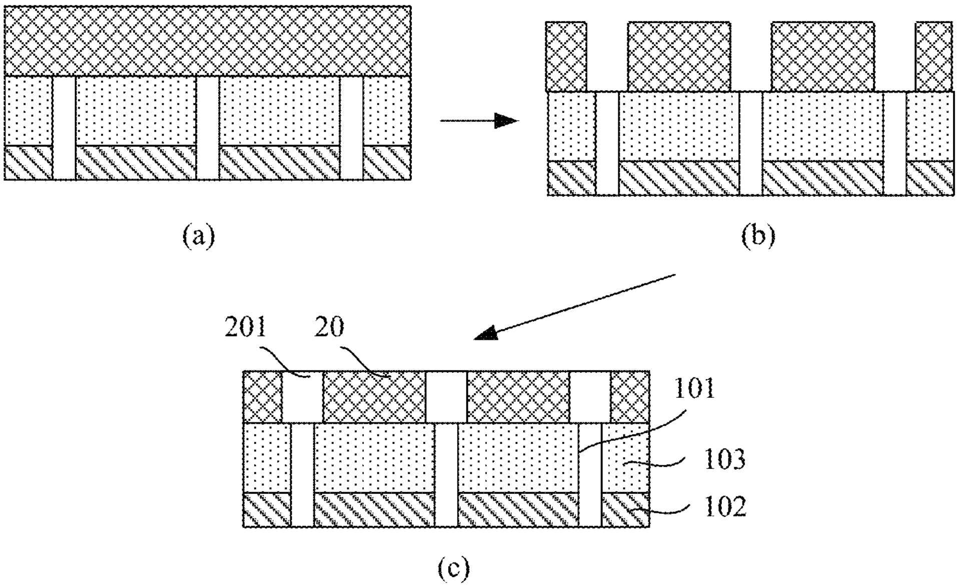
FIG. 7 is a schematic flowchart of a chip preparation method according to an embodiment of this application.

In some embodiments, in some embodiments, the first protective layer 20 and the first conductive connector 201 may be further prepared in a manner shown in FIG. 7. As shown in (a) in FIG. 7, a high modulus material is first prepared on the passive surface of the first chip 10, to form the first protective layer 20 covering the passive surface of the first chip 10. Then, as shown in (b) in FIG. 7, the TSV 101 is exposed to the first protective layer 20 through etching. Finally, as shown in (c) in FIG. 7, the first conductive connector 201 is prepared at an etched location of the first protective layer 20. For example, the first conductive connector 201 may be prepared by electroplating a copper pillar, by printing solder paste and reflowing, or through ball placement and reflowing.

Operation 4: Prepare a second protective layer 30 and a second conductive connector 104 on the active surface of the first chip 10. A manner of preparing the second protective layer 30 and the second conductive connector 104 on the active surface of the first chip 10 is similar to that in operation 3. For details, refer to operation 3. Details are not described herein again.

Figure 8:
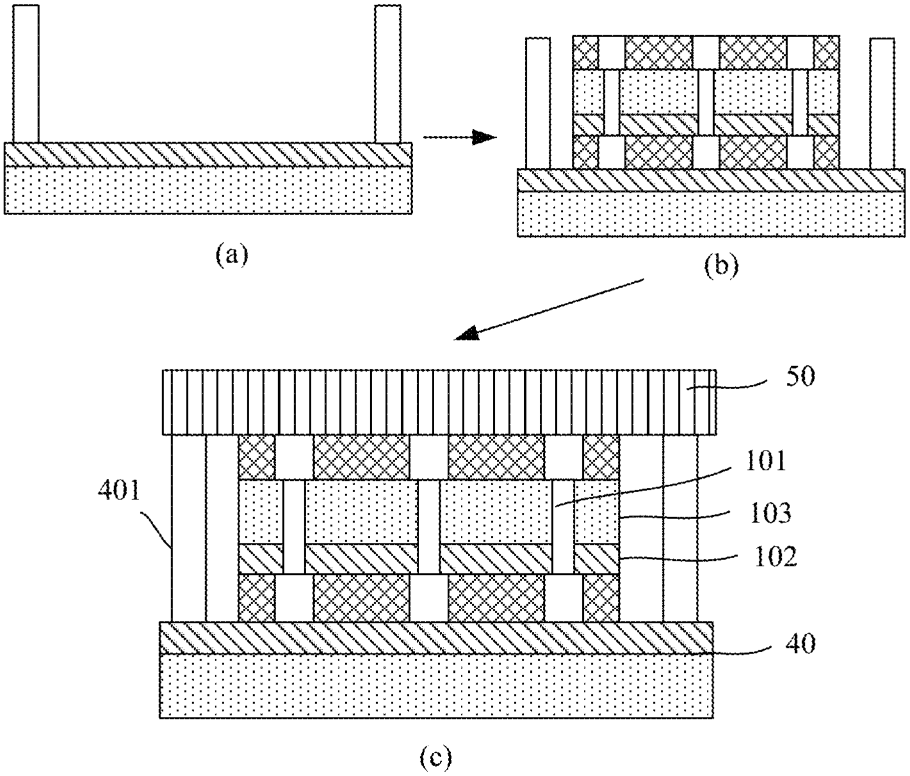
FIG. 8 is a schematic flowchart of a chip preparation method according to an embodiment of this application.

Operation 5: Prepare a conductive connector on an active surface of a second chip 40, which is shown in (a) in FIG. 8. For example, a large copper pillar is prepared on the active surface of the second chip 40 in a photolithography or electroplating manner.

Operation 6: Bond the active surface of the first chip 10 to the active surface of the second chip 40, which is shown in (b) in FIG. 8. The first chip 10 may be directly welded to the active surface of the second chip 40 (for example, welded through thermocompression bonding or through reflowing for a plurality of times). Then, a gap between the first chip 10 and the second chip 40 is filled through glue dispensing. That is, bonding between the first chip 10 and the second chip 40 is implemented through welding. In some embodiments, a non-conductive film (NCF) may be first attached to the active surface of the first chip 10, and then the first chip 10 is directly welded to the second chip 40.

Operation 7: Prepare one or more RDLs 50 above the first chip 10, as shown in (c) in FIG. 8.

Figure 9:
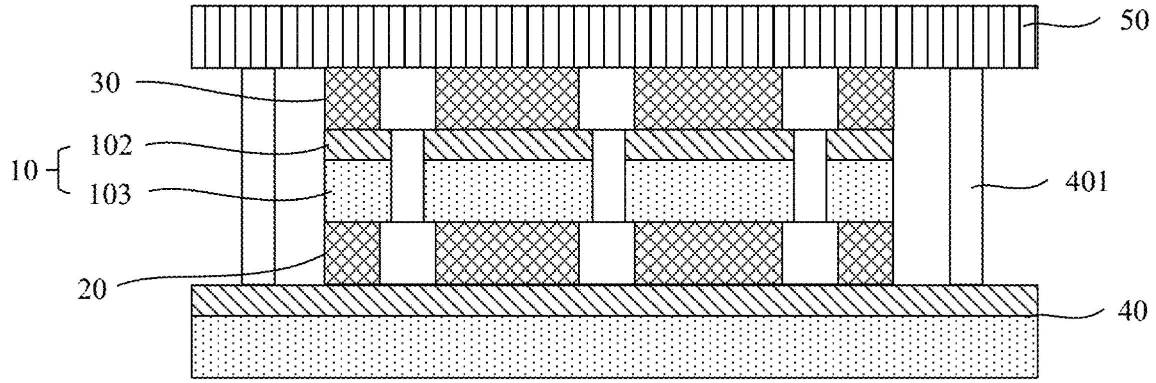
FIG. 9 is a schematic diagram of a cross section of a chip stack structure according to an embodiment of this application.

FIG. 9 is a schematic diagram of a cross section of a chip stack structure according to an embodiment of this application. As shown in FIG. 9, another chip stack structure provided in this embodiment of this application includes a first chip 10 and a second chip 40. A first conductive connector 201 on a passive surface of the first chip 10 is bonded to an active surface of the second chip 40, so that the first chip 10 is stacked above the second chip 40. In other words, in this embodiment, the passive surface of the first chip 10 is bonded to the active surface of the second chip 40.

In some embodiments, one or more RDLs 50 may be further prepared above the first chip 10. A second conductive connector 104 on the first chip 10 is connected to the RDL 50, so that the first chip 10 is electrically connected to another chip or circuit structure by using the RDL 50, to lead out a signal of the first chip 10. The second chip 40 located below the first chip 10 may also be connected to the RDL 50 by using a conductive connector 401 (for example, a copper pillar or a solder ball), so that the second chip 40 is electrically connected to the another chip or circuit structure by using the RDL 50, to lead out a signal of the second chip 40. In addition, a gap between the second chip 40 and the RDL 50 may be further filled, by using a molding process, with a molding material used for filling, to support the RDL 50.

In this embodiment, a preparation process of the chip stack structure is similar to that in FIG. 5 to FIG. 8. A difference mainly lies in that in this embodiment, the passive surface of the first chip 10 is bonded to the active surface of the second chip 40. For a preparation process, refer to descriptions corresponding to FIG. 5 to FIG. 8. Details are not described herein again.

Figure 10:
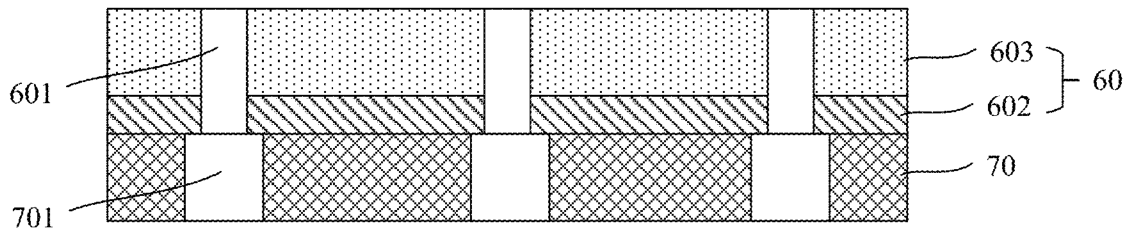
FIG. 10 is a schematic diagram of a cross section of a chip structure according to an embodiment of this application.

FIG. 10 is a schematic diagram of a cross section of a chip structure according to an embodiment of this application. As shown in FIG. 10, the chip structure provided in this embodiment of this application includes a third chip 60 and a third protective layer 70.

A TSV 601 is prepared on the third chip 60. The TSV 601 is disposed through the third chip 60, that is, two ends of the TSV 601 are respectively exposed to an active surface and a passive surface of the third chip 60.

It should be noted that, the third chip 60 may include a metal component layer 602 and a substrate layer 603. One surface on which the metal component layer 602 is located is the active surface, and the other surface on which the substrate layer 603 is located is the passive surface.

The third protective layer 70 covers the active surface of the third chip 60. A third conductive connector 701 is disposed through the third protective layer 70. One end of the third conductive connector 701 is electrically connected to the third chip 60, and the other end of the third conductive connector is exposed to the third protective layer 70. The third conductive connector 701 may be a conductive connector such as a copper pillar.

A thickness of the third protective layer 70 may be determined based on a thickness of the third chip 60 or a thickness requirement of chip stack package, so that the third protective layer 70 can ensure an overall thickness of the third chip 60 or meet the thickness requirement of chip stack package while improving strength of the third chip 60. The thickness of the third protective layer 70 is not limited in this embodiment of this application.

It should be noted that, to ensure that the third protective layer 70 can effectively improve strength of the chip, the third protective layer 70 is formed by a material whose modulus is greater than a preset value. The foregoing preset value may be determined based on an actual situation, for example, may be determined based on a chip stacking process or a clamping manner in a chip transfer process. In some embodiments, the third protective layer 70 may be formed by a material whose modulus is greater than 5 GPa. For example, the third protective layer 70 may be a polymer protective layer, a silicon nitride protective layer, or a silicon oxide protective layer.

Figure 11:
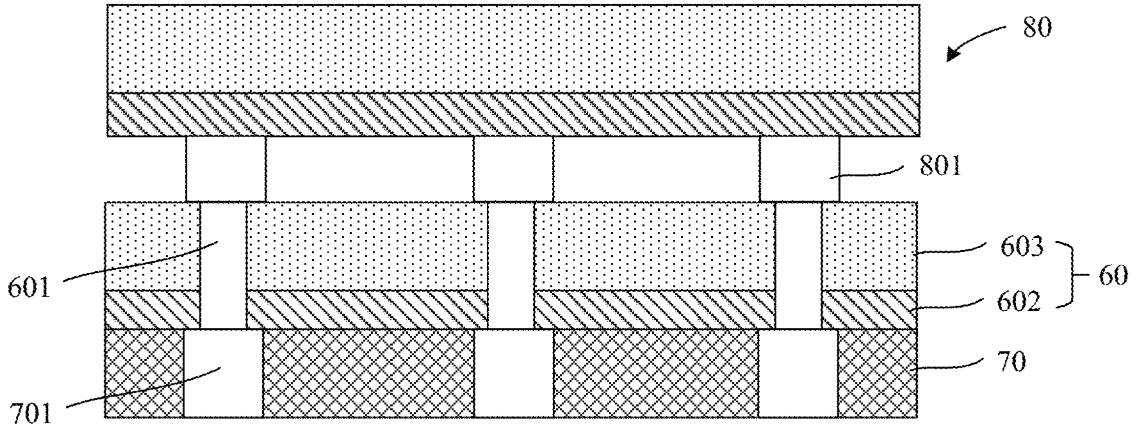
FIG. 11 is a schematic diagram of a cross section of a chip stack structure according to an embodiment of this application.

FIG. 11 is a schematic diagram of a cross section of a chip stack structure according to an embodiment of this application. As shown in FIG. 11, the chip stack structure provided in this embodiment of this application includes a third chip 60 and a fourth chip 80. A passive surface of the third chip 60 is bonded to an active surface of the fourth chip 80, so that the fourth chip 80 is stacked above the third chip 60. For a structure of the third chip 60, refer to the embodiment corresponding to FIG. 10. Details are not described herein again. In some embodiments, a fourth conductive connector 801 may be disposed on the active surface of the fourth chip 80. The fourth conductive connector 801 is connected to a TSV 601 on the passive surface of the third chip 60, to implement electrical connection between the fourth chip 80 and the third chip 60.

In other words, in this embodiment, the third chip 60 provided with a third protective layer 70 is located in a lower-layer location in the chip stack structure. The TSV 601 on the passive surface of the third chip 60 is directly connected to the upper-layer fourth chip 80, to implement vertical stacking of the third chip 60 and the fourth chip 80.

In this embodiment, a process of preparing the chip stack structure includes:

preparing the TSV on the third chip 60. For example, puncturing is performed through etching on an active surface of the third chip 60 in a direction towards the passive surface, and then electroplating is performed on a hole obtained through etching, to obtain the TSV 601.

The passive surface of the third chip 60 is ground by using a BVR process, so that the TSV 601 is exposed to the passive surface of the third chip 60.

The third protective layer 70 and a third conductive connector 701 are prepared on the active surface of the third chip 60, so that the third protective layer 70 covers the active surface of the third chip 60. The third conductive connector 701 is disposed through the third protective layer 70. One end of the third conductive connector 701 is electrically connected to the third chip 60, and the other end of the third conductive connector 701 is exposed to the third protective layer 70.

The passive surface of the third chip 60 is bonded to the active surface of the fourth chip 80, so that the fourth chip 80 is stacked above the third chip 60.

Figure 12:
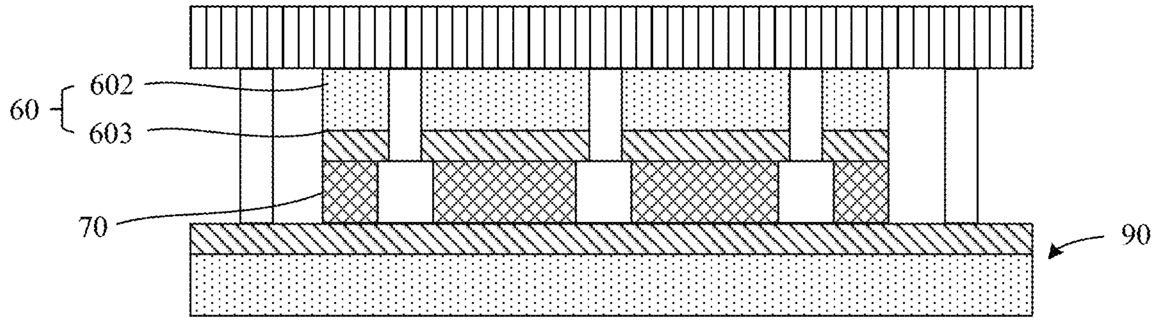
FIG. 12 is a schematic diagram of a cross section of a chip stack structure according to an embodiment of this application.

FIG. 12 is a schematic diagram of a cross section of a chip stack structure according to an embodiment of this application. As shown in FIG. 12, the chip stack structure provided in this embodiment of this application includes a third chip 60 and a fifth chip 90. An active surface of the third chip 60 is bonded to an active surface of the fifth chip 90, so that the third chip is stacked above the fifth chip. For a structure of the third chip 60, refer to the embodiment corresponding to FIG. 10. Details are not described herein again.

In some embodiments, one or more RDLs may be further prepared above the third chip 60. A TSV 601 on the third chip 60 is directly connected to the RDL, so that the third chip 60 is electrically connected to another chip or circuit structure by using the RDL, to lead out a signal of the third chip 60. The fifth chip 90 located below the third chip 60 may also be connected to the RDL by using a conductive connector (for example, a copper pillar or a copper protrusion), so that the fifth chip 90 is electrically connected to another chip or circuit structure by using the RDL, to lead out a signal of the fifth chip 90. In addition, a gap between the fifth chip 90 and the RDL may be further filled, by using a molding process, with a molding material used for filling, to support the RDL.

An embodiment of this application further provides a wafer structure, including a wafer and a third protective layer. The third protective layer covers a first surface of the wafer. A third conductive connector is vertically disposed in the third protective layer. The third conductive connector penetrates through an upper surface and a lower surface of the third protective layer. One end of the third conductive connector is electrically connected to the first surface of the wafer, and the other end of the third conductive connector is exposed to the third protective layer. The first surface of the wafer may be an active surface or a passive surface of the wafer, which is not limited herein.

The wafer is a silicon wafer used for manufacturing a semiconductor transistor or an integrated circuit. Because a shape of the silicon wafer is circular, the wafer may be referred to as a wafer. Various circuit element structures may be fabricated on the wafer through processing, to form a plurality of dies on the wafer. Finally, singulation (dicing) is performed on the dies on the wafer to obtain a plurality of chips.

In some embodiments, the third protective layer may cover the first surface of the wafer by using a molding process. In this way, after singulation is performed on the wafer, a plurality of chips covered with the third protective layer can be obtained.

In some embodiments, the third protective layer is formed by a material whose modulus is greater than 5 GPa. For example, the third protective layer is a polymer protective layer, a silicon nitride protective layer, or a silicon oxide protective layer.

A thickness of the third protective layer may be determined based on a thickness of the wafer, or a package thickness requirement of the chip after singulation is performed on the wafer to obtain the chip, so that the third protective layer can ensure an overall thickness of a first chip 10 or meet a thickness requirement of stack package while improving strength of the wafer. In some embodiments, in some embodiments, the third protective layer is 10 um to 50 um. It may be clearly understood by persons skilled in the art that, for the purpose of convenient and brief description, for a detailed working process of the foregoing system, apparatus, and unit, refer to a corresponding process in the foregoing method embodiment. Details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the conventional technology, or all or some of the technical solutions may be implemented in a form of a software product. The computer software product is stored in a storage medium and includes several instructions for instructing a computer device (which may be a personal computer, a server, a network device, or the like) to perform all or some of the operations of the methods described in embodiments of this application. The foregoing storage medium includes any medium that can store program code, such as a USB flash drive, a removable hard disk, a read-only memory, a random access memory, a magnetic disk, or an optical disc.

What is claimed is:

1. A chip structure, comprising:

a first chip and a first protective layer, wherein the first protective layer covers a first surface of the first chip, the first protective layer serves as a support structure of the first chip to improve strength and deformation resistance of the first chip, and a thickness of the first protective layer is 10 um to 50 um; and a first conductive connector vertically disposed in the first protective layer, the first conductive connector to penetrate through an upper surface and a lower surface of the first protective layer, one end of the first conductive connector electrically connected to the first surface of the first chip, and the other end of the first conductive connector exposed to the first protective layer.

2. The chip structure according to claim 1, wherein:

a second conductive connector is disposed on a second surface of the first chip, and one end of the second conductive connector is electrically connected to the second surface of the first chip; and the second surface is an opposite surface of the first surface, and the second surface is an active surface or a passive surface of the first chip.

3. The chip structure according to claim 2, wherein:

a second protective layer covers the second surface of the first chip, the second conductive connector is vertically disposed in the second protective layer, the second conductive connector penetrates through an upper surface and a lower surface of the second protective layer, the other end of the second conductive connector is exposed to the second protective layer, and the second protective layer is formed by a material whose modulus is greater than a preset value.

4. The chip structure according to claim 1, wherein the first protective layer is formed by a material whose modulus is greater than 5 GPa.

5. The chip structure according to claim 1, wherein the first protective layer is a polymer protective layer, a silicon nitride protective layer, or a silicon oxide protective layer.

6. The chip structure according to claim 1, wherein the first protective layer covers the first surface of the first chip by using a molding process.

7. The chip structure according to claim 1, wherein a TSV (through silicon via) is prepared on the first chip.

8. The chip structure according to claim 2, further comprising:

a second chip, wherein the first surface or the second surface of the first chip is bonded to the second chip, and wherein the first chip is stacked above the second chip.

9. A chip preparation method, comprising:

preparing a first protective layer and a first conductive connector on a first surface of a first chip, wherein:

the first protective layer serves as a support structure of the first chip to improve strength and deformation resistance of the first chip;

a thickness of the first protective layer is 10 um to 50 um;

the first protective layer covers the first surface of the first chip;

the first conductive connector is vertically disposed in the first protective layer;

the first conductive connector penetrates through an upper surface and a lower surface of the first protective layer;

one end of the first conductive connector is electrically connected to the first surface of the first chip and the other end of the first conductive connector is exposed to the first protective layer; and the first protective layer is formed by a material whose modulus is greater than a preset value.

10. The chip preparation method according to claim 9, wherein the preparing the first protective layer and the first conductive connector on the first surface of the first chip further comprises:

preparing the first conductive connector on the first surface of the first chip, wherein the one end of the first conductive connector is electrically connected to the first surface of the first chip;

covering a protective material on the first surface of the first chip by using a molding process, to form the first protective layer, wherein the protective material is a material whose modulus is greater than the preset value; and grinding the first protective layer to expose the other end of the first conductive connector.

11. The chip preparation method according to claim 9, wherein the preparing the first protective layer and the first conductive connector on the first surface of the first chip further comprises:

covering a protective material on the first surface of the first chip by using a molding process, to form the first protective layer;

etching the first protective layer to form a vertical channel being capable of exposing the first surface of the first chip; and preparing the first conductive connector in the vertical channel of the first protective layer, wherein the one end of the first conductive connector is electrically connected to the first surface of the first chip.

12. The chip preparation method according to claim 11, wherein the method further comprises:

preparing a second conductive connector on a second surface of the first chip, wherein one end of the second conductive connector is electrically connected to the first chip, the second surface is an opposite surface of the first surface, and the second surface is an active surface or a passive surface of the first chip.

13. The chip preparation method according to claim 12, wherein the method further comprises:

covering the protective material on the second surface of the first chip by using the molding process to form a second protective layer, wherein:

the second conductive connector is vertically disposed in the second protective layer;

the second conductive connector penetrates through an upper surface and a lower surface of the second protective layer; and the other end of the second conductive connector is exposed to the second protective layer.

14. The chip preparation method according to claim 13, wherein the method further comprises:

preparing a TSV (through silicon via) on the second surface of the first chip, wherein the second surface is the active surface of the first chip; and grinding the first surface of the first chip by using a backside via reveal (BVR) process, wherein the TSV is exposed to the first surface.

15. The chip preparation method according to claim 12, wherein the method further comprises:

bonding the first surface or the second surface of the first chip to a second chip, wherein the first chip is stacked above the second chip.

* * * * *